US012060951B2

(12) United States Patent
Marzinotto et al.

(10) Patent No.: US 12,060,951 B2
(45) Date of Patent: Aug. 13, 2024

(54) ADJUSTMENT DEVICE FOR A VACUUM AREA WITH PRESSURE MEASURING FUNCTIONALITY

(71) Applicant: VAT Holding AG, Haag (CH)

(72) Inventors: Alejandro Marzinotto, Sennwald (CH); Adrian Eschenmoser, Werdenberg (CH); Andreas Hofer, Chur (CH); Frantisek Balon, Sevelen (CH); Michael Zickar, Goldach (CH)

(73) Assignee: VAT HOLDING AG, Haag (CH)

( * ) Notice: Subject to any disclaimer, the term of this patent is extended or adjusted under 35 U.S.C. 154(b) by 0 days.

(21) Appl. No.: 17/769,215

(22) PCT Filed: Oct. 15, 2020

(86) PCT No.: PCT/EP2020/078993
§ 371 (c)(1),
(2) Date: Apr. 14, 2022

(87) PCT Pub. No.: WO2021/074270
PCT Pub. Date: Apr. 22, 2021

(65) Prior Publication Data
US 2024/0003464 A1   Jan. 4, 2024

(30) Foreign Application Priority Data
Oct. 16, 2019 (DE) ............ 10 2019 007 194.8

(51) Int. Cl.
*F16K 41/10* (2006.01)
*F16K 31/04* (2006.01)
(Continued)

(52) U.S. Cl.
CPC ........... *F16K 37/005* (2013.01); *F16K 31/04* (2013.01); *F16K 41/10* (2013.01); *F16K 51/02* (2013.01); *H01L 21/68742* (2013.01)

(58) Field of Classification Search
CPC ................. F16K 41/10; F16K 51/02
See application file for complete search history.

(56) References Cited

U.S. PATENT DOCUMENTS

| | | | |
|---|---|---|---|
| 6,041,814 A | 3/2000 | Kouketsu et al. | |
| 6,056,266 A | 5/2000 | Blecha | |
| (Continued) | | | |

FOREIGN PATENT DOCUMENTS

| | | |
|---|---|---|
| CN | 101149507 A | 3/2008 |
| CN | 101205606 A | 6/2008 |
| (Continued) | | |

OTHER PUBLICATIONS

"Notification of Transmittal of the International Search Report and the Written Opinion of the International Searching Authority, or the Declaration," International Filing Date: Oct. 15, 2020, International Application No. PCT/EP2020/078993, Applicant: VAT Holding AG, dated Feb. 8, 2021, pp. 1-11.
(Continued)

*Primary Examiner* — Paul J Gray
(74) *Attorney, Agent, or Firm* — Muncy, Geissler, Olds, & Lowe, P.C.

(57) ABSTRACT

Vacuum adjustment device for an active element movable in a process atmosphere region, having a coupling, a drive unit having an electric motor, which cooperates with the coupling in such a way that the coupling can be adjusted from a normal position into an active position and back. The device has a mechanical interface for connecting the vacuum adjustment device to a process volume providing a process atmosphere, a dynamic separating device for separating the process atmosphere from an outer atmosphere region and a control and processing unit at least electrically connected to the drive unit and designed to control the electric motor. The control and processing unit is designed to derive motor state information based on the extent of a motor operating param-
(Continued)

eter, and has a pressure determination functionality designed in such a way that a load difference is derived by comparing the motor state information with a known motor target state, and a pressure difference between the outer atmosphere region and the process atmosphere region is derived on the basis of the load difference.

14 Claims, 3 Drawing Sheets

(51) Int. Cl.
  *F16K 37/00* (2006.01)
  *F16K 51/02* (2006.01)
  *H01L 21/687* (2006.01)

(56) References Cited

U.S. PATENT DOCUMENTS

| | | | |
|---|---|---|---|
| 6,089,537 | A | 7/2000 | Olmsted |
| 6,289,737 | B1 | 9/2001 | Kouketsu et al. |
| 6,416,037 | B1 | 7/2002 | Geiser |
| 6,481,723 | B1 | 11/2002 | Hao et al. |
| 6,646,857 | B2 | 11/2003 | Anderson et al. |
| 9,490,151 | B2 | 11/2016 | Yuji et al. |
| 10,167,978 | B2 | 1/2019 | Masahiro et al. |
| 10,707,112 | B2 | 7/2020 | Volz et al. |
| 10,840,124 | B2 | 11/2020 | Zvokelj |
| 2005/0092438 | A1 | 5/2005 | Hur et al. |
| 2006/0238953 | A1 | 10/2006 | Hanawa et al. |
| 2008/0149032 | A1 | 6/2008 | Jung |
| 2010/0013626 | A1 | 1/2010 | Park et al. |
| 2010/0208409 | A1 | 8/2010 | Bluck et al. |
| 2016/0313037 | A1* | 10/2016 | Takahashi ................ H02P 8/30 |
| 2018/0051825 | A1* | 2/2018 | Ehrne .................... F16K 51/02 |

FOREIGN PATENT DOCUMENTS

| | | |
|---|---|---|
| CN | 102005395 A | 4/2011 |
| CN | 107002900 A | 8/2017 |
| CN | 107064195 A | 8/2017 |
| CN | 108511381 A | 9/2018 |
| CN | 108878328 A | 11/2018 |
| CN | 109420893 A | 3/2019 |
| EP | 3361316 A1 | 8/2018 |
| EP | 3421851 A1 | 1/2019 |
| JP | H05129421 A | 5/1993 |
| JP | 2007146908 A | 6/2007 |
| JP | 2017050534 A | 9/2017 |
| JP | 6368882 B1 | 8/2018 |

OTHER PUBLICATIONS

International Preliminary Report on Patentability. dated Apr. 19, 2022.

* cited by examiner

ADJUSTMENT DEVICE FOR A VACUUM AREA WITH PRESSURE MEASURING FUNCTIONALITY

CROSS-REFERENCE TO RELATED APPLICATIONS

The present application is the National Stage of International Application No. PCT/EP2020/078993, filed on Oct. 15, 2020, which claims priority from German patent application No. 10 2019 007 194.8 filed on Oct. 16, 2019, the disclosure of both of which should be understood to be incorporated into this specification.

The invention relates to a vacuum adjustment device for moving and positioning an active element, which can be coupled to a drive unit by means of a coupling, in a process atmosphere.

Such adjustment devices designed for vacuum applications are used, for example, for positioning a substrate to be processed in a vacuum chamber. The substrate is typically introduced into the process volume by a robot, where it must be placed on specific depositing points in the chamber and lifted off these points again after processing. This positioning and movement in the process chamber is realized by means of specific adjustment devices, so-called pin lifting systems, also called pin lifters.

Pin lifting systems are used in particular for vacuum chamber systems in IC, semiconductor, flat panel or substrate production, which must take place in a protected atmosphere, if possible without the presence of contaminating particles.

Such vacuum chamber systems comprise in particular at least one evacuable vacuum chamber which is provided for accommodating semiconductor elements or substrates to be processed or produced and which has at least one or two vacuum chamber openings through which the semiconductor elements or other substrates can be guided into and/or out of the vacuum chamber. For example, in a production line for semiconductor wafers or liquid crystal substrates, the highly sensitive semiconductor or liquid crystal elements pass sequentially through several process vacuum chambers in which the parts located within the process vacuum chambers are processed by means of one processing device each.

Such process chambers often have additional adjustment devices such as a transfer valve, whose cross-section is adapted to the substrate and robot and through which the substrate can be introduced into the vacuum chamber and, if necessary, removed after the intended processing. Alternatively, a further adjustment device (transfer valve) can be provided, through which the processed substrate is brought out of the chamber.

The substrate, e.g. a wafer, is guided, for example, by a suitably designed and controlled robot arm, which can be moved through the opening of the process chamber provided by the transfer valve. The process chamber is then loaded by lifting or gripping the substrate with the robot arm, bringing the substrate into the process chamber and depositing the substrate in a defined manner. The process chamber can be emptied in a corresponding manner.

For the placement of the substrate and for the exact positioning of the substrate in the chamber, a relatively high accuracy and mobility of the substrate must be ensured. For this purpose, pin lifting systems are used which can provide a plurality of support points for the substrate and thus a load distribution (due to the substrate's own weight) over the entire substrate.

The substrate is placed by the robot on the extended lifting pins of the lifting system and, by lowering the pins, the substrate is placed on a carrier, e.g. a potential plate (chuck). For this purpose, the robot arm, which typically carries the substrate, is moved out of the chamber. The pins can be lowered further after the substrate has been deposited and are then separated from the substrate, i.e. there is no contact between the pins and the substrate. After removing the robot arm and closing (and introducing process gas or evacuating) the chamber, the processing step is performed.

A low force effect on the substrate is of great importance, especially after the process step has been carried out in the chamber and during subsequent lifting of the substrate. The substrate typically has a relatively smooth surface that comes into contact with the carrier and rests on it during the depositing process. When trying to detach the substrate from the carrier, a negative pressure acting between the substrate and the carrier can cause a kind of sticking—e.g. caused by air pockets. If the substrate is pushed away from the carrier too quickly, the substrate may break because the adhesive forces cannot be overcome or dissolved, at least not at certain points of contact. In addition, even if the contact between the lifting pins and the substrate is established, the resulting bumping against the substrate can lead to undesired stress (or breakage). A corresponding application of force on the substrate is therefore a critical factor in substrate handling within the chamber.

At the same time, the aim is to ensure that the substrates to be processed are treated as gently and carefully as possible and that the processing time is as short as possible. This means that the substrate can be brought into the defined states—loading and unloading position and processing position—in the chamber as quickly as possible.

To avoid unwanted shocks during e.g. the processing of semiconductor wafers, U.S. Pat. No. 6,481,723 B1 proposes the use of a special stop device instead of hard motion stops in a pin lifter. Possible hard plastic stops should be replaced here by a combination of a soft stop part and a hard stop, wherein the contact with the soft stop part is first established for the limitation of movement and then the hard stop is brought into contact with the soft stop part and damped accordingly.

U.S. Pat. No. 6,646,857 B2 proposes a regulation of the lifting movement by means of a detected occurring force. The lifting pins can be moved depending on the force signal received, so that the lifting force at the lifting pins always acts on the wafer in a dosed and controlled manner.

A further aspect for working processes under vacuum conditions and with applied potentials is the possible influence of electrical and/or magnetic sources of interference. In this context, possible influences on the machining process have to be considered especially when designing a pin lifting system. For example, US 2005/0092438 A1 proposes a lifting device whose lifting pins can be electrically separated from a control plate by means of a non-conductive material.

Naturally, parts of the components moved with a vacuum adjustment device are present in a process volume and are therefore also exposed to the influences of a machining process. As a result, these parts can experience increased wear and tear and typically require regular or on-demand maintenance or must be replaced regularly or as needed.

In the case of a vacuum adjustment device designed as a pin lifting device, the lifting pins in particular are exposed to these wear influences and must be replaced accordingly.

In the case of a vacuum adjustment device designed as a vacuum valve, the valve closure (valve disk) is particularly affected by process-related wear. These closures are therefore also subject to such special maintenance requirements.

In general, vacuum valves for regulating a volume or mass flow rate and/or for the essentially gas-tight closing of a flow path leading through an opening formed in a valve housing are known from the prior art in various embodiments and are used—as mentioned above—especially in vacuum chamber systems in the IC, semiconductor or substrate production sector, which must take place in a protected atmosphere, if possible without the presence of contaminating particles. Both during the machining process within the process vacuum chambers and during the transport from chamber to chamber, the highly sensitive semiconductor elements or substrates must always be in a protected atmosphere—especially in a vacuum environment.

For this purpose, on the one hand peripheral valves are used to open and close a gas supply or exhaust and on the other hand transfer valves are used to open and close the transfer openings of the vacuum chambers for the insertion and removal of parts.

The vacuum valves through which semiconductor parts pass are called vacuum transfer valves due to the described field of application and the associated dimensioning, and also called rectangular valves due to their mainly rectangular opening cross-section and also called slide valves, rectangular slide valves or transfer slide valves due to their usual mode of operation.

Peripheral valves are especially used to control or regulate the gas flow between a vacuum chamber and a vacuum pump or another vacuum chamber. Peripheral valves are located, for example, within a pipe system between a process vacuum chamber or a transfer chamber and a vacuum pump, the atmosphere or another process vacuum chamber. The opening cross-section of such valves, also known as pump valves, is usually smaller than that of a vacuum transfer valve. Since peripheral valves, depending on the area of application, are not only used to fully open and close an opening, but also to control or regulate a flow rate by continuously adjusting the opening cross-section between a fully open position and a gas-tight closed position, they are also known as regulating valves. A possible peripheral valve for controlling or regulating the gas flow is the pendulum valve.

In a typical pendulum valve, as for example known from U.S. Pat. No. 6,089,537 (Olmsted), in a first step a normally round valve disk is rotatably pivoted via a normally also round opening from a position releasing the opening to an intermediate position covering the opening. In the case of a slide valve, as described in U.S. Pat. No. 6,416,037 (Geiser) or U.S. Pat. No. 6,056,266 (Blecha), the valve disk, like the opening, is usually rectangular in shape and in this first step is pushed linearly from a position releasing the opening into an intermediate position covering the opening. In this intermediate position, the valve disk of the pendulum or slide valve is in a spaced opposite position to the valve seat surrounding the opening. In a second step, the distance between the valve disk and the valve seat is reduced so that the valve disk and the valve seat are pressed evenly against each other and the opening is sealed essentially gastight. This second movement preferably takes place essentially in a direction perpendicular to the valve seat. Sealing can be achieved, for example, either by means of a sealing ring arranged on the closure side of the valve disk, which is pressed onto the valve seat surrounding the opening, or by a sealing ring on the valve seat, against which the closure side of the valve disk is pressed. The closing process, which takes place in two steps, subjects the sealing ring between the valve disk and the valve seat to hardly any shear forces that would destroy the sealing ring, since the movement of the valve disk in the second step takes place essentially in a straight line perpendicular to the valve seat.

In the overall view of the above-mentioned vacuum adjustment devices, i.e. in particular pin lifting systems and vacuum valves, they have in common that they are each connected to a vacuum volume, i.e. a process chamber. In order to carry out a defined machining process within the process volume, a predetermined process atmosphere, in particular a certain internal pressure, is typically set. Such a precisely adjusted internal pressure in connection with e.g. a process gas used is part of a processing program and thus a critical parameter with regard to the guarantee of a process quality to be ensured. In other words, the reliability of the internal pressure setting has a corresponding effect on the reliability of the machining process.

To determine and monitor the process atmosphere, pressure sensors are typically used which are arranged in or connected to the process volume. The provision of one or more such pressure sensors means at the same time an additional expenditure regarding the construction of the vacuum system, in particular regarding tightness and the avoidance of potential differences. Furthermore, such sensors are an additional source of error in the system, i.e. if one of these sensors fails, the process can come to a complete standstill.

It is therefore the object of the present invention to offer a solution to avoid the above mentioned disadvantages.

In particular, it is the object of the invention to provide an improved vacuum adjustment device which helps to avoid the above disadvantages.

The invention is also based on the object of providing a respectively improved vacuum adjustment device for reliable process execution.

These objects are solved by the realization of the characteristic features of independent claims. Features which further develop the invention in an alternative or advantageous way can be taken from the dependent claims.

The invention is based on the realization that with the exact knowledge of a structural design and in particular the dynamic behavior of a vacuum adjustment device such a device can be extended by further functionalities, which in turn make more information concerning a machining process accessible. Thus, additional information about a vacuum process can be provided without the need for an additional component to generate the information.

More concretely, within the scope of the present invention, a motor of an adjustment device is operated by means of certain control commands and a current feedback based on a motor state is received and further processed, i.e. during operation an actual state of the motor (e.g. total motor load) is recorded. In addition to the actual state, a corresponding target state (e.g. motor system load) is known for the motor. The target state indicates, for example, under which conditions (e.g. temperature, pressure, humidity, accumulated motor hours, total operating time, etc.) which load the motor can be expected to overcome.

From a comparison of the actual state with the target state, additional information can then be obtained, which allows an indication of the prevailing operating conditions. In particular, a differential pressure can be derived from a load or force difference that can be determined in this way.

The invention thus relates to a vacuum adjustment device for an active element movable in a process atmosphere, in particular in a vacuum region. The vacuum adjustment device has a coupling designed for coupling the active element and a drive unit comprising an electric motor, which is designed and cooperates with the coupling in such a way that the coupling can be adjusted by means of the electric motor from a normal position into an active position and back.

In the normal position, the active element, in a coupled state (i.e. the active element is connected to the coupling), is in a state which is essentially free of effect with regard to its intended effect. In the active position, the active element in the coupled state provides its intended effect (e.g. carrying a substrate or closing a valve opening).

The vacuum adjustment device also has a mechanical interface for connecting the vacuum adjustment device to a process volume providing a process atmosphere, a dynamic separating device for defining the process atmosphere area by separating the process atmosphere from an outer atmosphere area, wherein the drive unit is at least partially assigned to the outer atmosphere area and the coupling to the process atmosphere area, and a control and processing unit at least electrically connected to the drive unit and designed to control the electric motor.

In particular, the dynamic separating device is coupled or connected to the drive unit and/or the coupling in such a way that the separating device is partially moved accordingly when the coupling is adjusted.

The control and processing unit is adapted to derive motor state information based on a magnitude of a received motor operating parameter, wherein the magnitude of the motor operating parameter depends at least on a total motor load during controlled operation of the electric motor. The control and processing unit also has a pressure determination functionality designed in such a way that, when the pressure determination functionality is carried out, a load difference is derived by comparing the motor state information with a known motor target state, wherein the known motor target state depends at least on a current state of the components of the vacuum adjustment device which can be adjusted by means of the drive unit, and a pressure difference between the outer atmosphere region and the process atmosphere region is derived on the basis of the load difference.

In a specific embodiment, the control and processing unit is designed to derive an absolute pressure in the process atmosphere area based on the pressure difference. For this purpose, information about a currently prevailing pressure in the outer atmosphere area is used in particular. This information can be acquired by measuring the pressure or as a known quantity.

This provides a direct pressure measurement for the internal volume of a vacuum process chamber. Corresponding measured values can also be provided as output and used, for example, to control or regulate a machining process in the process chamber. In particular, the pressure information (absolute pressure or pressure difference) can be taken into account for setting or regulating the process pressure.

In one embodiment, the motor operating parameter is a motor current applied to the electric motor. A measure of the actual motor current is thus obtained and processed as input by the control and processing unit.

The motor operating parameter can be embodied as a ratio between the adjustment distance travelled by the coupling and the motor operating time required for this. In other words, the time required for a certain coupling movement can be measured.

In one design, the control and processing unit can be designed in such a way that the motor state information can be derived as a counterforce applied to the electric motor from the ratio of the adjustment distance travelled and the operating time required for this.

According to the invention, in one embodiment, the motor target state can be a motor target current expected to be applied to the electric motor in a respective adjustment state (state of motion). For example, the expected motor current can be known to have a course over the adjustment distance that can be travelled by the electric motor or, with respect to a motor rotational speed, especially in relation to an operating time.

In one design, the known motor target state can be defined at least by a load acting on the drive unit or the electric motor through the coupling and/or the separating device. The load can be partially determined e.g. by a bellows resistance, i.e. a force required to compress a bellows over a defined distance of movement, or a weight force of a valve closure or pin (a pin lifting device). The motor target state can be changed accordingly in the range of a certain adjustment distance. Such a variation can also be known, determined and stored.

According to one embodiment, the known motor target state can form a dynamic (varying) reference value over an adjustment distance defined by the adjustability of the coupling.

In one design, the known motor target state can be determined by
  a calibration of the adjustment movement of the coupling in the range of the adjustment distance given by the adjustment device, in particular by an adjustment distance-operating time function,
  a model describing the vacuum adjustment device, in particular a digital computer model,
  a simulation of adjustment conditions in the range of the adjustment distance defined by the adjustability of the coupling, or
  averaging of measured loads and/or forces during repeated standard movement cycles.

In one embodiment, the drive unit can interact with the separating device in such a way that the separating device can be adjusted from the normal position to the active position and back by means of the electric motor. For example, the separating device can be connected directly to the drive unit or indirectly, e.g. by means of the coupling, to the drive unit.

The dynamic separating device can be designed in particular as a bellows or seal, especially as a diaphragm bellows or diaphragm seal. The separating device thus provides a dynamic seal which provides a sealing effect even if the separating device moves in the range of a certain distance.

The adjustment device is especially designed for use in a vacuum region, wherein one part of the adjustment device is present and moved in the vacuum region and another part, preferably parts of the drive unit, is present outside this area. The separating device for the atmospheric separation of the two areas can also be provided for this purpose by the drive unit and can be formed, for example, by a housing or bellows of the drive unit.

Alternatively, the separating device can also be provided in such a way that the coupling is present and moved partially or completely outside the vacuum range.

The separating device can be connected e.g. with the chamber wall of a process chamber.

The separating device can, for example, also be designed as a sliding bushing, which is sealed with an O-ring, for example.

The drive unit can be designed for a linear axial movement of the coupling along and/or parallel to an adjustment axis.

According to embodiments according to the invention, the active element can be realized as a lifting pin of a pin lifting device or as a valve closure of a vacuum valve.

According to one embodiment, the vacuum adjustment device is designed as a pin lifting device, in particular pin lifter, for the movement and positioning of a substrate to be processed, in particular a wafer, in the process atmosphere area which can be provided by a vacuum process chamber and has the coupling as the first coupling, in particular from a plurality of couplings.

Here the drive unit provides at least linear adjustability of the first coupling. The active position is formed by a mounting position for mounting the pin lifting device with the substrate and the coupling is designed to accommodate a lifting pin designed for contacting and supporting the substrate and forming the active element. The intended effect of the active element (lifting pin) can be regarded here as the carrying, lifting and lowering of a substrate to be processed.

The normal position, which can be achieved by the linear mobility of the first coupling, is represented in particular by a lowered position of the lifting pin, where there is no contact with the substrate.

In a further embodiment, the vacuum adjustment device can be designed as a vacuum valve, in particular a vacuum slide valve, pendulum valve or monovalve, for the regulation of a volume or mass flow and/or for the gas-tight interruption of a flow path. The vacuum adjustment device has a valve seat which has a valve opening defining an opening axis and a first sealing surface surrounding the valve opening, and also has a valve closure forming the active element, in particular a valve disk, for regulating the volume or mass flow and/or for interrupting the flow path (=intended effect), with a second sealing surface corresponding to the first sealing surface.

The valve closure is coupled to the drive unit by means of the coupling in such a way that the valve closure can be adjusted from an open position as normal position, in which the valve closure and a valve seat of the vacuum valve are present without contact relative to each other, to a closed position as active position, in which a sealing contact between the first sealing surface and the second sealing surface exists via an interposed seal and the valve opening is thereby closed in a gas-tight manner, and is adjustable back again. The coupling is designed accordingly to accommodate the valve closure.

The devices according to the invention are described in more detail in the following by means of concrete embodiment examples shown schematically in the drawings as examples only, wherein further advantages of the invention are also discussed, wherein.

Figure 1:
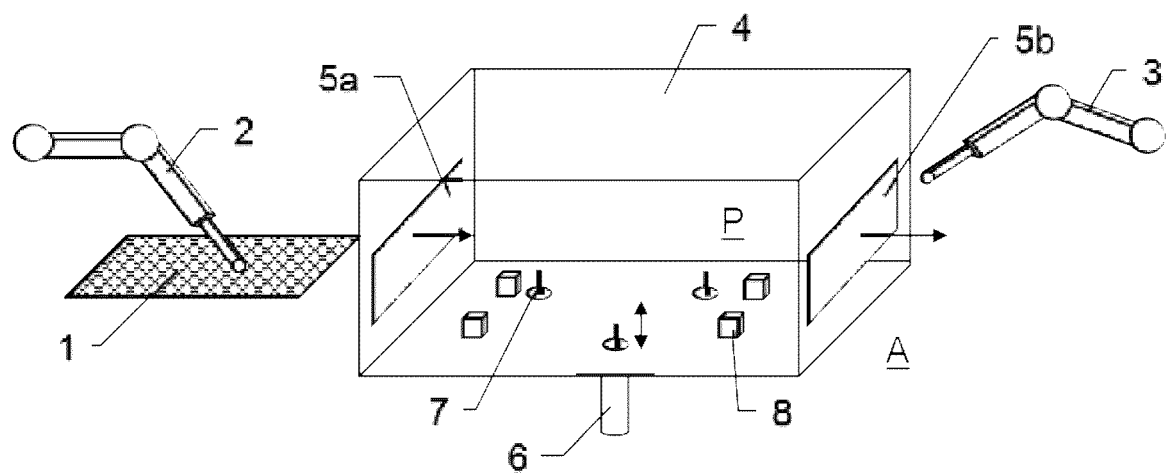
FIG. 1 shows a schematic representation of an embodiment of a vacuum processing system for a wafer with vacuum adjustment devices according to the invention.

FIG. 1 schematically shows a process setup for processing a semiconductor wafer 1 under vacuum conditions. The wafer 1 is brought into a vacuum chamber 4 (process atmosphere P) by means of a first robot arm 2 through a vacuum adjustment device designed as a first vacuum transfer valve 5a and brought into position by means of lifting pins 7 of vacuum adjustment devices designed according to the invention, here pin lifting devices (here: three pins shown). The wafer 1 is then picked up or placed on the pins 7 and the robot arm 2 is moved away. The pins of the pin lifting devices are here in an extended carrying position. The wafer 1 is typically placed on the robot arm or on a carrying device provided on the robot arm 2,3 or is held by a specific carrying device. After wafer 1 is picked up by pins 7, the robot arm is guided out of chamber 4, transfer valve 5a is closed and pins 7 are lowered (to the normal position). This is carried out by means of the drives 6 of the pin lifting devices which are coupled to the respective pins 7. The wafer 1 is thus placed on the four carrying elements 8 shown.

In this state, a desired processing (e.g. coating) of wafer 7 takes place under vacuum conditions and especially in a defined atmosphere (i.e. with a certain process gas and under defined pressure). For this purpose, chamber 4 is coupled to a vacuum pump and preferably with a vacuum regulating valve to regulate the chamber pressure (not shown).

After processing, wafer 1 is lifted into a removal position (carrying position) again by means of the pin lifting devices. With the second robot arm 3, wafer 1 is then removed by the second transfer valve 5b. Alternatively, the process can be designed with only one robot arm, in which case loading and unloading can then be performed by a single transfer valve.

Figure 2:
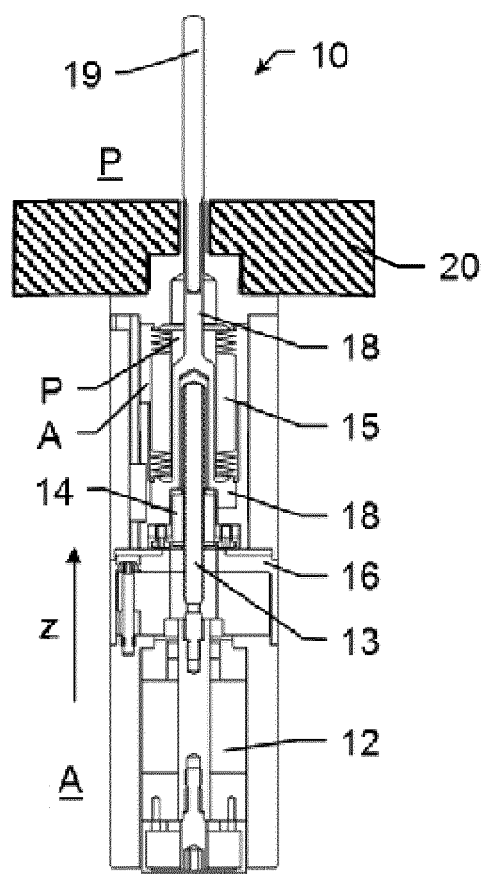
FIG. 2 shows an embodiment of a vacuum adjustment device according to the invention designed as a pin lifting device.

FIG. 2 shows an embodiment of a vacuum adjustment device according to the invention, which in this case is a pin lifting device 10.

A lifting pin 19 is locked in a coupling 18 of the device 10. The lifting pin 19 preferably has a metallic, polymer-based or ceramic material, in particular the pin 19 is completely made of such a material. The locking in the coupling 18 can, for example, be realized magnetically or by means of a clamp.

The coupling 18 can be moved in z direction by means of a slide 14. For this purpose, the slide 14 is coupled to a threaded spindle 13, which in turn is driven by a motor 12 of the drive unit.

An optional thermal and electrical insulation between the upper coupling part and the lower drive part is realized in one variant by a first insulating element 16, which thermally and electrically separates an upper housing part from a lower housing part. Preferably, a second insulating element, which may be embodied by the slide 14, may be provided. In this variant of the pin lifting device 10, the threaded spindle 13 is designed and mounted so precisely and rigidly that no (electrically or thermally conductive) contact (even during relative movement) occurs between the spindle 13 and the coupling 18. Alternatively, the spindle 13 is made of or coated with a non-conductive or thermally insulating material. This provides complete galvanic and thermal insulation between the upper and lower part in any state of the device 10. In a further variant, both the threaded spindle 13 and the slide 14 sitting on the spindle 13 can be made conductive (e.g. metallic). Insulation can then be realized in particular by means of e.g. an intermediate sleeve between spindle/slide and coupling.

It is understood that the above mentioned galvanic insulation is purely optional, but the invention extends to embodiments without such insulation.

The pin lifter 10 also has a bellows 15 in the interior. The bellows 15 is arranged and shaped in such a way that an atmospheric separation of a process atmosphere region P, in which the pin 19 (pin) is present and in which a machining process usually takes place, and an outer atmosphere region A, in which, for example, the drive 12 and other peripheral components may be present, is provided. The bellows 15 is compressed when the pin 19 is extended, wherein the atmospheric separation is maintained.

In the variant shown, adjusting slide 14 moves both coupling 18 and bellows 15. Both coupling 18 and bellows 15 are coupled to the slide at least indirectly. In particular, slide 14 is connected to coupling 18 and coupling 18 to bellows 20. A second end of the bellows is again connected to the housing of the pin lifting device.

The connections of the individual components are especially formed in a gas-tight manner.

The pin lifting device 10 is connected to the housing 20 of a vacuum process chamber. The connection is designed in such a way that an internal process atmosphere of the process chamber also affects the interior of the pin lifting device 10. A feed-through in the housing wall 20 provided for pin 19 ensures that the process atmosphere extends into the lifter 10, i.e. the process volume and part of the inner volume of the pin lifter 10 form a common process atmosphere region P.

The process atmosphere region P is limited within the pin lifting device 10 at least by the bellows 15. An inner bellows volume defined by bellows 15 is part of the process atmosphere region P. A further limitation, especially in the axial direction of movement, is also formed by a lower part of the coupling 18. Essentially, the atmosphere area separated from the process atmosphere region P is to be understood as outer atmosphere region A.

In the process atmosphere region P there can typically be a significantly lower pressure than in the outer atmosphere region A. Within the vacuum process chamber and thus also in the process atmosphere region P, very low pressures are present, especially for machining a workpiece. Typically, vacuum conditions prevail there. During operation of the pin lifting device 10, a significant pressure difference between process atmosphere P and outer atmosphere A can be assumed.

The present invention makes use of this pressure difference.

To move the movable system components, i.e. in this case the coupling 18 and the bellows 15, the electric motor 12 must overcome a system load caused by these components. The load here depends on the structural design of the components (e.g. mass), their movement properties (e.g. friction) and their current states (e.g. position, bellows compression etc.). This motor system load (motor target state) is known for pin lifter 10 or can be determined by calibration and stored in the control system. For this purpose, a look-up table, a model describing the pin lifter 10 sufficiently exactly or a motor-teaching process (repetition, monitoring, comparing and saving of a certain motion sequence) can be used. The motor system load thus describes a respective target state of the electric motor during operation under defined conditions, especially taking into account environmental conditions such as pressure, temperature, etc.

A control and processing unit is provided for moving the lifter 10 (not shown). For targeted control, motor 12 is supplied with an appropriate signal (motor control signal), e.g. to move to a predefined pin position. When operating motor 12, a motor operating parameter is provided. The extent of the motor operating parameter during controlled operation of the electric motor depends on a total motor load and thus represents a load currently applied to motor 12. For example, the motor operating parameter can be the motor current applied to the motor at any given time.

The control and processing unit is configured in such a way that motor state information can be derived from the motor operating parameter, i.e. a quantification of a current motor load or current motor current can be performed, for example. The control and processing unit thus provides the determination of an actual state of the electric motor.

This actual state can then be related to the known motor target state, i.e. the motor state information can be compared with the known motor system load (motor target state). Based on the exact knowledge of the motor system load, a load difference, i.e. a difference between the target load and the actual load, can be derived.

A pressure difference between the outer atmosphere region (A) and the process atmosphere region (P) is derived from the load difference thus determined.

Knowing the ambient pressure present in the outer atmosphere region (A), an absolute pressure in the process atmosphere region (P), i.e. in the process chamber, can then be determined.

With the present invention, the vacuum adjustment device thus provides an extended functionality of pressure measurement.

A (continuous) comparison of an existing motor operating parameter with a stored reference function (motor system load) also enables process monitoring and the recording of a status of the process volume. If, for example, a permissible maximum deviation is exceeded, a corresponding signal can be generated and output, wherein an impermissible system status can be indicated and, if necessary, a system check can be recommended.

By means of a motor operating parameter, monitoring over a longer period of time can be used to determine both the wear of one or more components of the pin lifting device and the process quality. By means of this long-term observation of repeated, similar process steps (process cycles), a trend of a change in the process can also be detected. A trend monitoring also allows a prognosis of a future system status and a correspondingly optimized planning of maintenance cycles.

Figure 3:
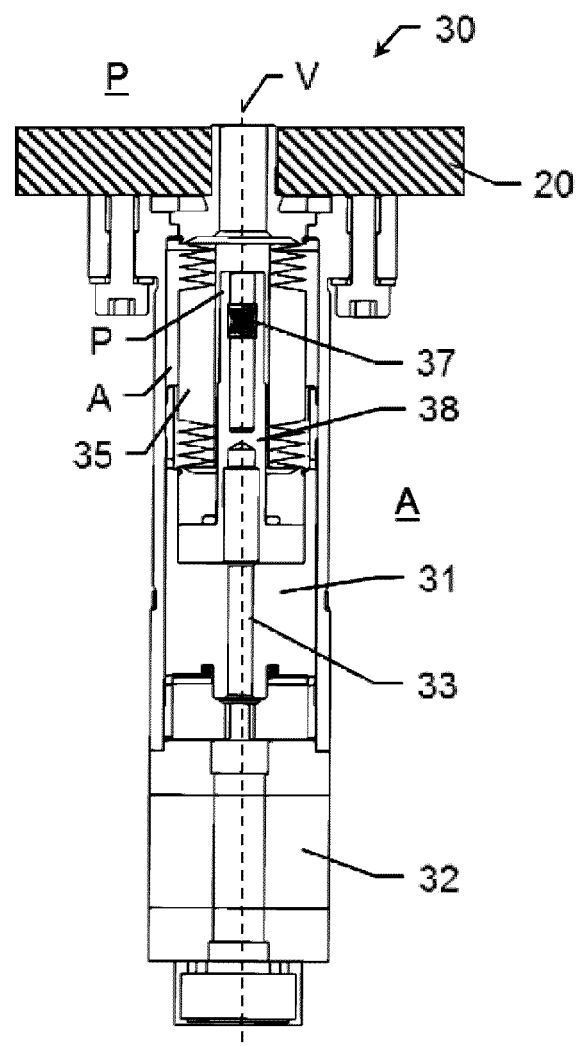
FIG. 3 shows a further embodiment of a vacuum adjustment device according to the invention designed as a pin lifting device.

FIG. 3 shows an embodiment of a pin lifting device 30 according to the invention. The pin lifting device 30 is shown in a lowered normal position.

FIG. 3 shows a drive unit of the pin lifting device 30 with a motor 32 (electric motor). The motor 32 can be a servo or stepper motor, for example. The drive unit is coupled to a shaft which is designed here as spindle 33, i.e. the shaft 33 can be rotated by means of motor 32. The rotation can be controlled in a managed manner, e.g. according to a given number of rotations, or it can be regulated.

Regulated operation is possible e.g. together with an encoder, wherein the encoder provides a control variable, e.g. in relation to the axial position of a bearing pin. In the example shown, spindle 33 has an external thread. The thread can be designed as trapezoidal, pointed or round thread. The threaded rod 33 (spindle) can thus be rotated by appropriate control of the motor 32.

The pin lifter 30 also comprises a sliding guide element 31 according to the invention. The sliding guide element 31 has a central recess extending axially in the direction of the sliding guide element 31, here coaxially relative to the adjustment axis V. The recess provides an internal thread. The internal thread can, for example, be provided directly by the sliding guide element 31, i.e. the internal thread can be cut into the material of the sliding guide element 31. Alternatively, the recess can be provided with e.g. a sleeve with internal thread.

The sliding guide element 31 is coupled to the external thread of the spindle 33 by means of its internal thread, i.e. external thread and internal thread correspond and interact. The external thread engages with the internal thread. The spindle 33 is directly coupled exclusively to the sliding guide element 31 as the moving element. In other words, the spindle provides a coupling of the drive 33 with the sliding guide element 31, in particular with only the sliding guide element 31.

This interaction allows the sliding guide element 31 to be moved back and forth in the direction of the extension of the adjustment axis V by turning the spindle 33. The movement can thus be performed axially along the adjustment axis V. For this purpose, the sliding guide element 31 can be mounted in such a way that the sliding guide element 31 is essentially unable to perform a rotational movement around the adjustment axis, but can only move axially.

The sliding guide element 31 is also connected to the coupling 38 of the pin lifting device 30. The coupling 38 can thus be moved axially analogous to the movement of the sliding guide element 31, especially from the shown lowered normal position to an extended carrying position.

Coupling 38 has a receptacle 37 for accommodating a lifting pin. Such a lifting pin is preferably designed for contacting and supporting a substrate (e.g. semiconductor wafer). The receptacle 37 comprises a ring or spiral spring, which provides a clamping locking of the lifting pin in the coupling 38. However, the receptacle can also have an alternative locking device (e.g. collet, magnet, screw thread, etc.). The lifting pin can be inserted axially from above along the axis V through an opening provided for this purpose in the pin lifting device 30, in particular in the receptacle 37 of the coupling 38.

The sliding guide element 31 thus forms a connecting component by means of which the lifting pin can ultimately be moved by the drive.

By selecting the appropriate material, the movement of the sliding guide element 31 can be performed with low friction and without lubricant. For example, PTFE or another non-stick material can be selected as the production material or surface coating. The sliding guide element 31 and/or the inner surface can comprise this material.

In addition, the pin lifter 30 has a bellows 35 designed as an atmospheric separating device. At its upper end, the bellows 35 is connected to the housing of the pin lifter 30 either indirectly (e.g. by means of a top-mounted housing seal) or directly. At its lower end, bellows 35 is connected to coupling 38 (base of coupling 38). The connections are each formed in a gas-tight manner. The inner volume or axial extension of the bellows 35 can be varied while maintaining an atmospheric separation, especially between the process atmosphere and the outside atmosphere.

Bellows 35 and coupling 38 are connected in such a way that coupling 38 provides a one-sided atmospheric seal for bellows 35. The bellows 35 and the coupling 38 thus limit a process atmosphere region P.

As a result of such an arrangement, the coupling 38 together with the bellows 35 can be moved linearly within the pin lifting device 30 by driving the spindle 33.

The pin lifting device 30 is connected or flanged to a process chamber 20 by means of a screw connection. This extends the volume of the process chamber by the internal volume of the pin lifter 30, which is limited on one side by the bellows 35 and the coupling 38, which in turn defines a process atmosphere region P. This is separated in a gas-tight manner from the outer atmosphere region A.

The pin lifting device 30 has a control and processing unit and an algorithm according to the embodiment as shown in FIG. 2, i.e. the pin lifting device 30 is designed to determine a pressure difference between the process atmosphere region P and the outer atmosphere region A on the basis of a detectable motor operating parameter.

Figure 4:
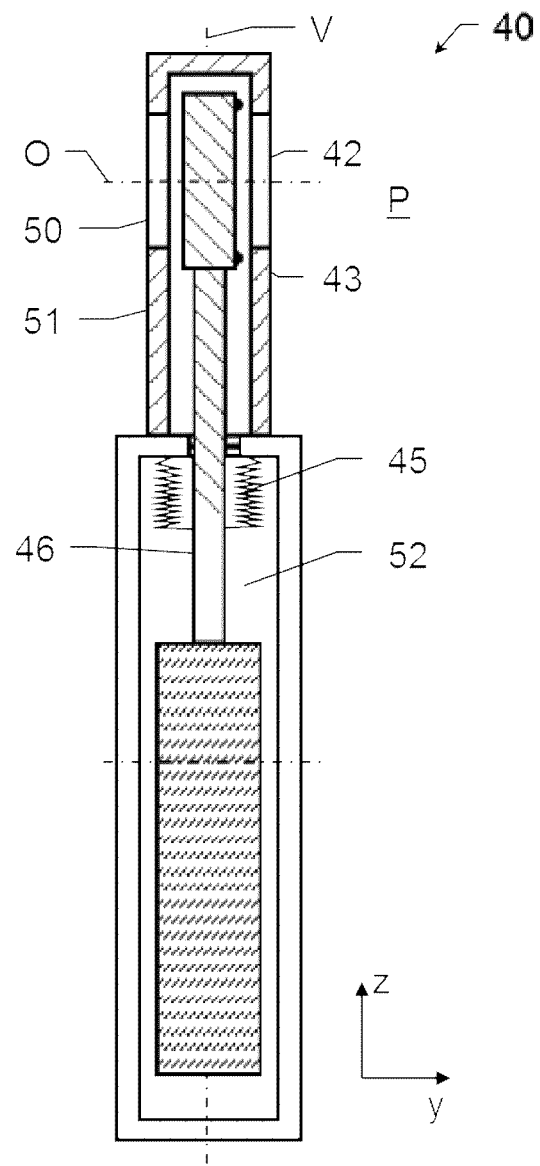
FIG. 4 shows an embodiment of a vacuum adjustment device according to the invention designed as a vacuum valve.

FIG. 4 shows another embodiment of a vacuum adjustment device 40 according to the invention, here a vacuum slide valve. The vacuum slide valve 40 has a valve housing with a valve wall that has an opening 42 with an opening axis O and with an elongated, essentially rectangular valve seat 43 that surrounds the opening 42. A closure element 50 with a closing side, especially one provided on the process side, which has a slightly larger cross-section than the opening 42, serves to close the opening 42 in a substantially gas-tight manner by pressing the closing side onto the valve seat 43. The closure element 50 is supported by two valve rods 46 arranged parallel to each other. The closure element 50 is connected to the valve rods by means of a coupling. The coupling can be realized e.g. by screwing or clamping. Since the valve rods are shown in FIG. 4 in side view, only one valve rod 46 is visible. According to alternative embodiments according to the invention, only a single valve rod 46 may be provided and the closure element 50 may be supported by it.

The valve housing is divided into a vacuum region 51, in which the opening 42, the valve seat 43 and the closure plate 50 are located, and a drive region 52, which is outside the vacuum region 52.

The two valve rods 46 are passed through two gas-tight feedthroughs, which are designed as diaphragm seals or diaphragm bellows 45 with seals at their end pieces (e.g. O-rings), in the valve housing from the vacuum region 51 to the drive region 52. The diaphragm seals or the diaphragm bellows 45 are designed in such a way that the valve rods 46 can be moved along a longitudinal axis and a transverse axis within a certain range of movement while maintaining the gas-tight seal.

Since the drive region 52 is separated in a gas-tight manner from the vacuum region 51, an atmospheric pressure can prevail in the drive region 52. Friction particles in drive region 52 cannot enter the sensitive vacuum region. A drive unit with motor is located in drive region 52.

The drive unit is designed in such a way that the closure plate 50 can be moved from an open position to the intermediate position shown here by moving the two valve rods 46 along the geometric longitudinal axis in a longitudinal closing direction z from an open position to the intermediate position shown here, and by adjusting the two valve rods 46 along the geometric transverse axis extending at right angles to the longitudinal axis in a transverse closing direction y from the intermediate position to a closing position and back (movement of the closure plate is L-shaped, hence the designation L-type).

The vacuum slide valve 40 or its opening 42 is designed to be connected to a vacuum process chamber. A process atmosphere in this chamber expands in such a connection up to and including vacuum region 51 of the vacuum slide valve 40. In other words, a process atmosphere region P is formed which includes at least both the volume of the vacuum chamber and the vacuum region 51 of the vacuum slide valve 40. This process atmosphere region P is separate from an outer atmosphere region A due to the sealed bellows 45. The drive region 52 is part of the outer atmosphere region A.

The vacuum slide valve 40 has a control and processing unit designed and configured in such a way that a differential pressure between process atmosphere P and outside atmosphere A can be determined by means thereof. For this purpose, a known target system load (target state of the valve) is compared with an operating parameter currently provided during operation (e.g. applied motor current). The pressure difference can be deduced from a load difference that can be derived from this.

For example, the greater the pressure difference, the lower the current operating load during a closing movement, provided that the pressure in the process atmosphere region P is lower than in the outer atmosphere region A.

Based on the load difference, a pressure difference can thus be derived, in particular by previous calibration of the system, i.e. by determining a function that describes the relationship between motor load difference and atmospheric pressure difference.

Finally, this concept can also be used to determine an absolute process pressure (if the existing pressure in the outer atmosphere region A is known) and thus for process monitoring in vacuum machining processes.

It is understood that the figures shown only schematically represent possible exemplary embodiments. According to the invention, the different approaches can be combined with each other as well as with vacuum devices especially for substrate processing (e.g. pin lifters) or prior-art vacuum valves.

The invention claimed is:

1. A Vacuum adjustment device for an active element movable in a process atmosphere region, in particular a vacuum region, having
    a coupling designed for coupling the active element,
    a drive unit having an electric motor, which is designed and interacts with the coupling in such a way that the coupling is adjustable by means of the electric motor from
        a normal position, in which the active element is in a coupled state essentially free of effect with respect to its intended effect, to
        an active position, in which the active element in coupled state provides its intended effect, and is adjustable back again,
    a mechanical interface for connecting the vacuum adjustment device to a process volume providing a process atmosphere,
    a dynamic separating device for defining the process atmosphere region by separating the process atmosphere from an outer atmosphere region, wherein the drive unit is at least partially assigned to the outer atmosphere region and the coupling is assigned to the process atmosphere region, and
    a control and processing unit at least electrically connected to the drive unit and designed to control the electric motor,
    wherein
    the control and processing unit
    is designed to derive motor state information based on a magnitude of a motor operating parameter, wherein the magnitude of the motor operating parameter depends at least on a total motor load during controlled operation of the electric motor, and
    has a pressure determination functionality designed in such a way that when the pressure determination functionality is carried out
        a load difference is derived by a comparison of the motor state information with a known motor target state, wherein the known motor target state depends at least on a current state of the components of the vacuum adjustment device which can be adjusted by means of the drive unit, and
        a pressure difference between the outer atmosphere region and the process atmosphere region is derived from the load difference.

2. The Vacuum adjustment device according to claim 1, wherein the motor operating parameter is a motor current applied to the electric motor.

3. The Vacuum adjustment device according to claim 1, wherein the motor operating parameter is embodied as a ratio of a travelled adjustment distance of the coupling and the operating time required for it.

4. The Vacuum adjustment device according to claim 3, wherein the control and processing unit is designed in such a way that the motor state information can be derived as a counterforce applied to the electric motor from the ratio of an adjustment distance travelled and the operating time required for this.

5. The Vacuum adjustment device according to claim 1, wherein the known motor target state is a motor target current to be expected to be applied to the electric motor in a respective adjustment state.

6. The Vacuum adjustment device according to claim 1, wherein the known motor target state is defined at least by a load acting through the coupling and/or separating device on the drive unit or the electric motor.

7. The Vacuum adjustment device according to claim 1, wherein the known motor target state forms a dynamic reference value over an adjustment distance defined by the adjustability of the coupling.

8. The Vacuum adjustment device according to claim 1, wherein the known motor target state is determined by
    a calibration of the adjustment movement of the coupling, in particular by an adjustment travel/operating time function,
    a model describing the vacuum adjustment device,
    a simulation of adjustment conditions over an adjustment distance defined by the adjustability of the coupling, or
    averaging of measured loads and/or forces during repeated standard movement cycles.

9. The Vacuum adjustment device according to claim 1, wherein the drive unit interacts with the separating device in such a way that the separating device can be adjusted from the normal position to the active position and back by means of the electric motor.

10. The Vacuum adjustment device according to claim 1, wherein the dynamic separating device is designed as a bellows or seal, in particular as a diaphragm bellows or diaphragm seal.

11. The Vacuum adjustment device according to claim 1, wherein the drive unit is designed for a linear axial movement of the coupling along and/or parallel to an adjustment axis.

12. The Vacuum adjustment device according to claim 1, wherein the active element is designed as a supporting pin or as a valve closure.

13. The Vacuum adjustment device according to claim 1, wherein the vacuum adjustment device is a pin lifting device, in particular a pin lifter, for moving and positioning a substrate to be processed, in particular of a wafer, in which at least a process atmosphere region which can be provided by a vacuum process chamber is formed and the pin lifting device has the coupling as first coupling, in particular from a plurality of couplings, wherein the drive unit provides a linear adjustability of the first coupling, the active position is formed by a mounting position for mounting the pin lifting device with the substrate, and the coupling is designed to accommodate a lifting pin designed for contacting and supporting the substrate and forming the active element.

14. The Vacuum adjustment device according to claim 1, wherein the vacuum adjustment device is designed as a vacuum valve, in particular a vacuum slide valve, pendulum valve or monovalve, for regulating a volume or mass flow and/or for gas-tight interruption of a flow path, having a valve seat comprising a valve opening 424 defining an opening axis and a first sealing surface surrounding the valve opening, a valve closure forming the active element, in particular a valve disk, for regulating the volume or mass flow and/or for interrupting the flow path, having a second sealing surface corresponding to the first sealing surface, wherein the valve closure 65% is coupled to the drive unit by means of the coupling in such a way that the valve closure is adjustable from an open position as a normal position, in which the valve closure and the valve seat of the vacuum valve are present in a contactless manner relative to each other, to a closed position as the active position, in which a sealing contact between the first sealing surface and the second sealing surface exists via an interposed seal and the valve opening is thereby closed in a gas-tight manner, and is adjustable back again, and the coupling is designed to accommodate the valve closure.

* * * * *